United States Patent
Huang et al.

[11] Patent Number: 6,154,409
[45] Date of Patent: Nov. 28, 2000

[54] SELF ROW-IDENTIFIED HIDDEN REFRESH CIRCUIT AND REFRESH METHOD THEREOF

[75] Inventors: Hong-Yi Huang, Taipei; Chien-hung Lin, Taipei Hsien, both of Taiwan

[73] Assignee: Industrial Technology Research Institute, Taiwan

[21] Appl. No.: 09/505,507

[22] Filed: Feb. 17, 2000

[30] Foreign Application Priority Data

May 20, 1999 [TW] Taiwan ................................. 88108251

[51] Int. Cl.$^7$ ....................................................... G11C 7/00
[52] U.S. Cl. ...................... 365/222; 365/194; 365/230.08
[58] Field of Search ............................. 365/222, 189.05, 365/230.08, 238.5, 194

[56] References Cited

U.S. PATENT DOCUMENTS

| | | | |
|---|---|---|---|
| 5,193,072 | 3/1993 | Frenkil et al. ........................... | 365/222 |
| 5,583,823 | 12/1996 | Park ......................................... | 365/222 |
| 5,835,401 | 11/1998 | Green et al. ............................. | 365/222 |
| 5,862,093 | 1/1999 | Sakakibara ............................... | 365/222 |
| 5,982,697 | 11/1999 | William et al. .......................... | 365/222 |

*Primary Examiner*—Son T. Dinh
*Attorney, Agent, or Firm*—Fish & Richardson P.C.

[57] ABSTRACT

A self row-identified hidden refresh circuit for refreshing a pseudo SRAM comprises a latchable burst array. The latchable burst array is composed of several latchable burst units, equipped respectively with a selector, delay elements and a state recording device. The selector selectively outputs a refresh pulse in accordance with the registered state of the state recording device. The refresh pulse is sequentially delayed by passing through the delay elements to refresh several rows of the pseudo SRAM. The state recording device records a first state before the refresh pulse enters the latchable burst units, a second state after the refresh pulse enters the latchable burst units, and the first state when the refresh pulse leaves the latchable burst units. In certain embodiments, the selector may include a multiplexer and the state recording device may include a SR flip-flop.

5 Claims, 9 Drawing Sheets

SELF ROW-IDENTIFIED HIDDEN REFRESH CIRCUIT AND REFRESH METHOD THEREOF

BACKGROUND OF THE INVENTION

1. Field of the Invention

The present invention relates to a refresh circuit and a method for refreshing, and in particular, to a self row-identified hidden refresh circuit and a method for refreshing a pseudo static random access memory (pseudo SRAM).

2. Description of the Related Art

Memory is an integral component in circuit design. Dynamic random access memory (DRAM) has the advantage of being small in size. However, a DRAM requires periodic refreshing and the 1T1C memory cells used within the DRAM require special processes for their manufacture. Static random access memory (SRAM), on the other hand, has the advantage of being easy to operate. However, the SRAM requires a larger area and the high resistance resistors of the poly load 4T memory cells used within the SRAM also require special processes for their manufacture. Consequently, a 4T pseudo SRAM because it is advantageously small and easy to operate has become the best option for general CMOS processes.

FIG. 1A illustrates the configuration of a pseudo SRAM. In FIG. 1A, the pseudo SRAM comprises a memory cell array 10, a column decoder 12, a row decoder 14, a multiplexer M1, a refresh counter 16 and a controller 18. Upon accessing the memory cell array 10, the column decoder 12 and the row decoder 14 respectively receive a column address CA and a row address RA. The decoders decode the column address CA and the row address RA to obtain driving signals for accessing the memory cell array 10. Specifically, these driving signals are then sent to bit lines $B_0$, $B_0'$~$B_{m-1}$, $B_{m-1}'$ and word lines $W_0$~$W_{n-1}$ of the memory cell array 10 for accessing the corresponding memory cells. Conversely, upon refreshing the memory cell array 10, the row decoder 14 will accept a refresh signal REF generated by the refresh counter 16 and refresh the memory cell array 10 by row. The multiplexer M1 selectively sends the row address RA or the refresh signal REF to the row decoder 14. The refresh counter 16 is controlled by the control circuit 18 to periodically generate the refresh signals REF.

FIG. 1B illustrates a partial circuit of the memory cell array 10 of FIG. 1A. In FIG. 1B, the memory cell array 10 comprises word lines $W_0$~$W_3$ and bit lines $B_0$, $B_0'$~$B_3$, $B_3'$, memory cells 1 and pre-charge transistors $T_0$, $T_0'$~$T_3$, $T_3'$. Each of the memory cells 1 is located at the intersections of the word lines $W_0$~$W_3$ and the bit lines $B_0$, $B_0'$~$B_3$, $B_3'$. The pre-charge transistors $T_0$, $T_0'$~$T_3$, $T_3'$ are respectively serially connected to the bit lines $B_0$, $B_0'$~$B_3$, $B_3'$ and are controlled by a pre-charge signal PRE.

In accordance with the framework of FIGS. 1A and 1B, the memory cell array can be refreshed by the row in the following modes: external refresh, self-refresh and hidden refresh. FIGS. 2A to 2C are diagrams illustrating the time sequence of an external refresh, a self-refresh and a hidden refresh, respectively. In FIG. 2A, the external refresh of the memory cell array 10 is determined by a refresh request provided by an external control circuit (not shown). In FIG. 2B, the self-refresh of the memory cell array 10 is determined by a refresh request provided by an internal control circuit (not shown) at non-accessing cycles. In FIG. 2C, the hidden refresh of the memory cell array 10 is determined by adding an extra refresh execution time span to each access cycle. As can be seen from the above, the self refresh requires a forceful interrupt to refresh the memory cell array 10 when continuously accessing (no gap) the memory cell array 10 for a considerable time, thus preventing data loss. The hidden refresh will decrease the maximal operation frequency, since an extra time span for refreshing is added to each access cycle. However, the overall operation (as in an SRAM) of the hidden refresh is easier, and has the advantages of being small in area and needing low direct current.

FIG. 3 illustrates a partial access circuit of a pseudo SRAM. In FIG. 3, each memory cell 1 comprises four transistors $X_1$~$X_4$, and the access circuit 2 comprises two buffers $BF_1$, $BF_2$, a column decoder 3, an inverter $IN_1$ and a sensor amplifier $SA_1$. In this case, an NMOS transistor can be replaced with a PMOS transistor to generate the pre-charge signal PRE. When external data $D_{in}$ are to be written to the memory cell 1, corresponding to a word line $W_1$ and a pair of bit lines $B_x$, $B_x'$, the bit lines $B_x$ and $B_x'$ are first driven by the external data $D_{in}$ (the bit line $B_x$ is driven through the buffer $BF_1$, and the bit line $B_x'$ is driven through the inverter $IN_1$ and the buffer $BF_2$). Then, the word line $W_1$ is opened for writing the external data $D_{in}$ into the memory cell 1.

Upon reading the memory cell 1 corresponding to the word line $W_i$ and the bit lines $B_x$ and $B_x'$, the bit lines $B_x$ and $B_x'$ are first pre-charged to $V_{DD}$-$V_{TN}$ (pre-charged by the NMOS transistor) or $V_{DD}$ (pre-charged by the PMOS transistor). Then, the word line $W_i$ is opened to obtain the data $D_{out}$ in the memory cell 1 through the sensor amplifier $SA_1$. Upon refreshing, the pre-charge signal PRE and the word line $W_i$ must be opened simultaneously so the drain voltage of the closed transistors in the memory cell can be recovered to $V_{DD}$-$V_{TN}$ or $V_{DD}$ for leakage compensation.

FIGS. 4A–4C are diagrams respectively illustrating the time sequence of a pseudo SRAM in writing, reading and refreshing modes. Upon writing in FIG. 4A, the pre-charge transistors $T_x$ and $T_x'$ and the buffers $BF_1$ and $BF_2$ are first turned on by a pre-charge signal PRE and a write request Write, and the bit lines $B_x$ and $B_x'$ are driven with the external data $D_{in}$. Thereafter, the word line $W_i$ is turned on for writing the external data $D_{in}$ to the corresponding memory cells. Upon reading in FIG. 4B, the pre-charge transistors $T_x$ and $T_x'$ are first turned on by the pre-charge signal PRE to pre-charge the bit lines $B_x$ and $B_x'$ to around $V_{DD}$-$V_{TN}$. The word line $W_i$ is then turned on for outputting the data $D_{out}$ in the memory cell through the sensing amplifier $SA_1$. Upon refreshing in FIG. 4C, the pre-charge transistors $T_x$ and $T_x'$ are first turned on by the pre-charge signal PRE, and the word line $W_i$ is simultaneously turned on to complete the refresh.

In a pseudo SRAM, a refresh row address is typically generated by a refresh counter, hence taking a longer refresh cycle. To reduce the time needed for decoding the row address, Frenkil (U.S. Pat. No. 5,193,072) and Green (U.S. Pat. No. 5,835,401) both use a ring shift register to replace the existing refresh counters. FIG. 5A illustrates the framework of a ring shift register. In FIG. 5A, outputs of the ring shift register 16' and the row decoder 14 are selected by a multiplexer M1 and sent directly to the word lines $W_0$~$W_{n-1}$ of the memory cell array 10. FIG. 5B illustrates the circuit of the ring shift register 16' in FIG. 5A. In FIG. 5B, several D-type flip-flops $D_1$~$D_n$ are connected to form a ring-shaped structure with outputs of the D-type flip-flops $D_1$~$D_n$ being synchronized with a system clock CLK and sent respectively to the word lines of memory cell array 10.

Frenkil and Green's ring shift register structure, however, refreshes only a row in each cycle. Therefore, when the frequency of the system clock CLK is too low, inadequate refresh rates may result in lost data. Conversely, when the frequency of the system clock CLK is too high, excessive refresh rates may result in unnecessary power consumption.

Accordingly, an object of this invention is to provide a self row-identified hidden refresh circuit and a method of refresh to prevent data loss and excess power consumption due to inadequate system clocks.

SUMMARY OF THE INVENTION

To achieve the above and other objects, this invention provides a self row-identified hidden refresh circuit for refreshing a pseudo SRAM.

In one general aspect of this invention, the self row-identified hidden refresh circuit includes a latchable burst array. The latchable burst array is composed of several latchable burst units, each equipped with a selector, delay elements and a state recording device. The selector is configured to selectively output a refresh pulse in accordance with the registered state of the state recording device. The refresh pulse is sequentially delayed by passing through the delay elements to refresh several rows of the pseudo SRAM. The state recording device records a first state before the refresh pulse enters these delay elements and records a second state after the refresh pulse pass through these delay elements.

Embodiments of this aspect of the invention may include one or more of the following features. The selector of the self row-identified hidden refresh circuit may have a multiplexer. Also, the time delay of each delay element has a duration that is of sufficient duration to refresh a row of the pseudo SRAM.

The state recording device may comprise an SR flip-flop for setting to the first state when the refresh pulse starts entering the first delay element of these delay elements and for setting to the second state when the refresh pulse passes through the last delay element of these delay elements.

In another aspect of the invention a self row-identified hidden refresh method for refreshing a pseudo SRAM includes the following steps. A refresh pulse is first generated upon initiating the refresh. The refresh pulse is then sequentially delayed to sequentially refresh several rows of word lines in the pseudo SRAM in each system clock of the refresh period. The refresh state of all word lines in the pseudo SRAM is further recorded. From the non-refresh word line that is closest to the last already-refreshed word line, the sequential delay and recording steps are repeated in the next system clock of the refresh period in accordance with the refresh state of the pseudo SRAM until the pseudo SRAM is fully refreshed.

BRIEF DESCRIPTION OF THE DRAWINGS

The aforementioned objects, features and advantages of this invention will become apparent by referring to the following detailed description of a preferred embodiment with reference to the accompanying drawings, wherein.

DETAILED DESCRIPTION

To facilitate the overall operation of the hidden refresh, the specification of its input and output signals is selected to be the same as that used by a SRAM. Further, because 4T memory cells are advantageously small in area and require low direct current, the embodiment of this invention employs such memory cells. In this embodiment, a pre-charging, an accessing (reading/writing) and a refreshing will be performed in each access cycle (CLK). The main spirit of this invention addresses the refreshing of several rows of word lines within each access cycle (CLK) in a pseudo SRAM to prevent data loss and excess power consumption due to inadequate refresh rates.

An embodiment of this invention will be specified in further detail as follows.

Figure 1A:
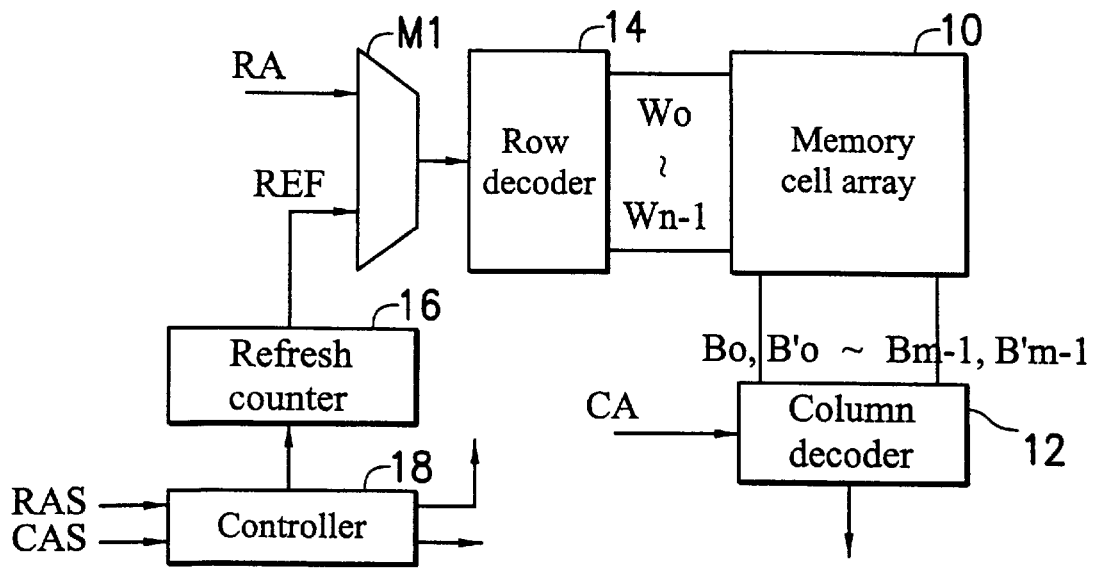
FIG. 1A illustrates the framework of a pseudo SRAM.
Figure 1B:
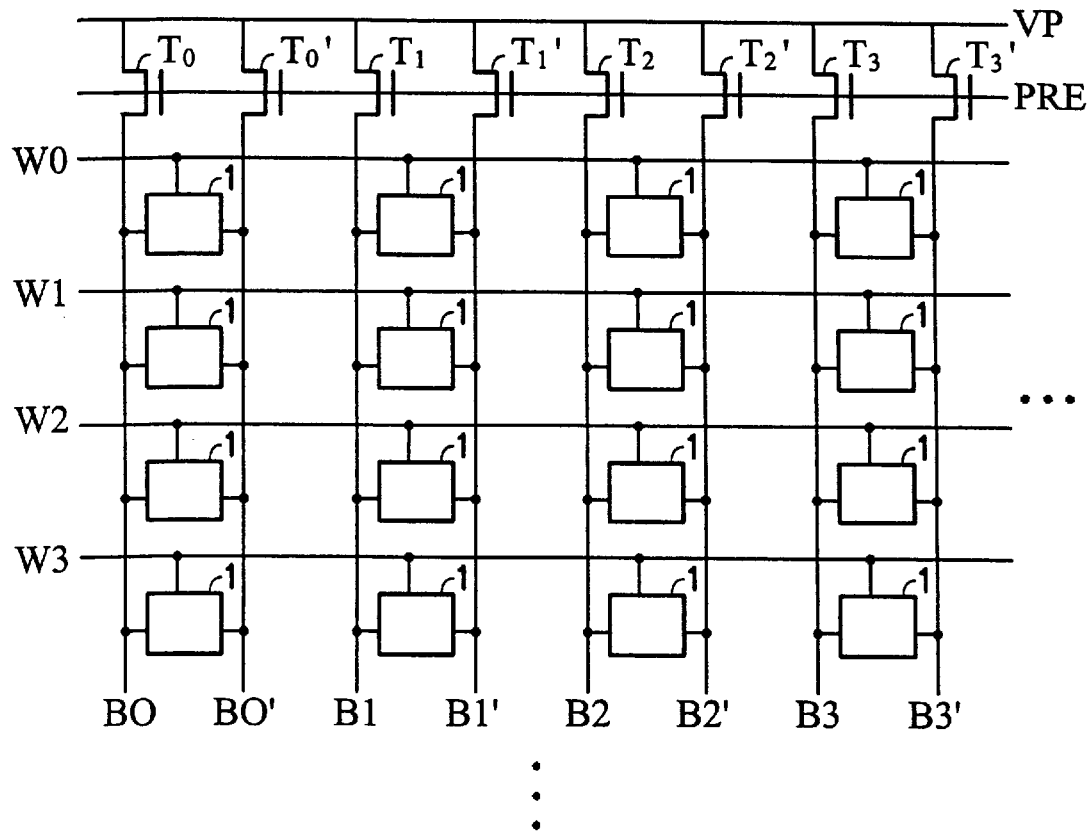
FIG. 1B illustrates a partial circuit of the memory cell array in FIG. 1A.
Figure 2A:
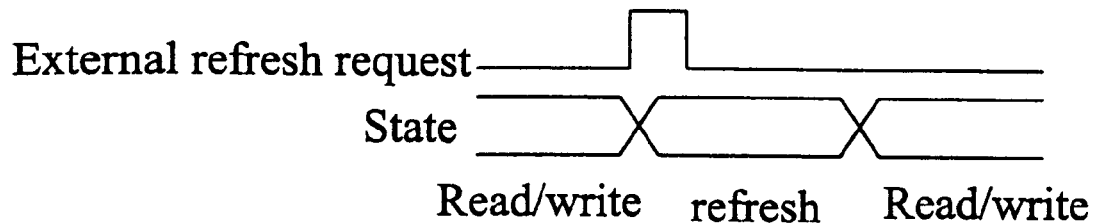
FIGS. 2A to 2C are diagrams illustrating the time sequence of external fresh, self-refresh and hidden refresh.
Figure 2B:
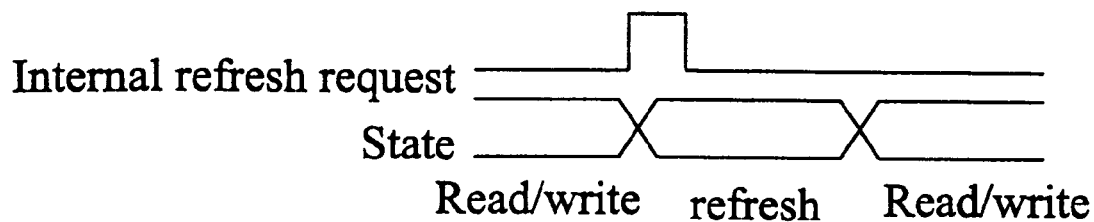
Figure 2C:
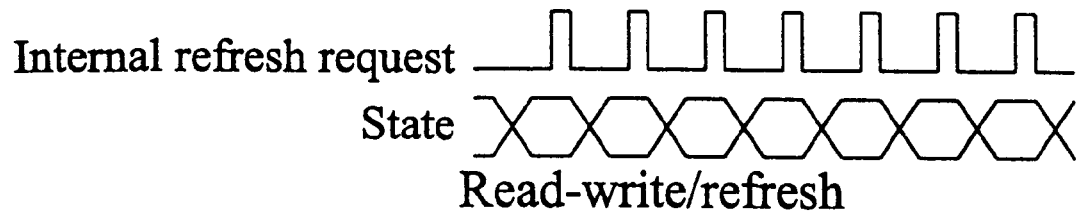
Figure 3:
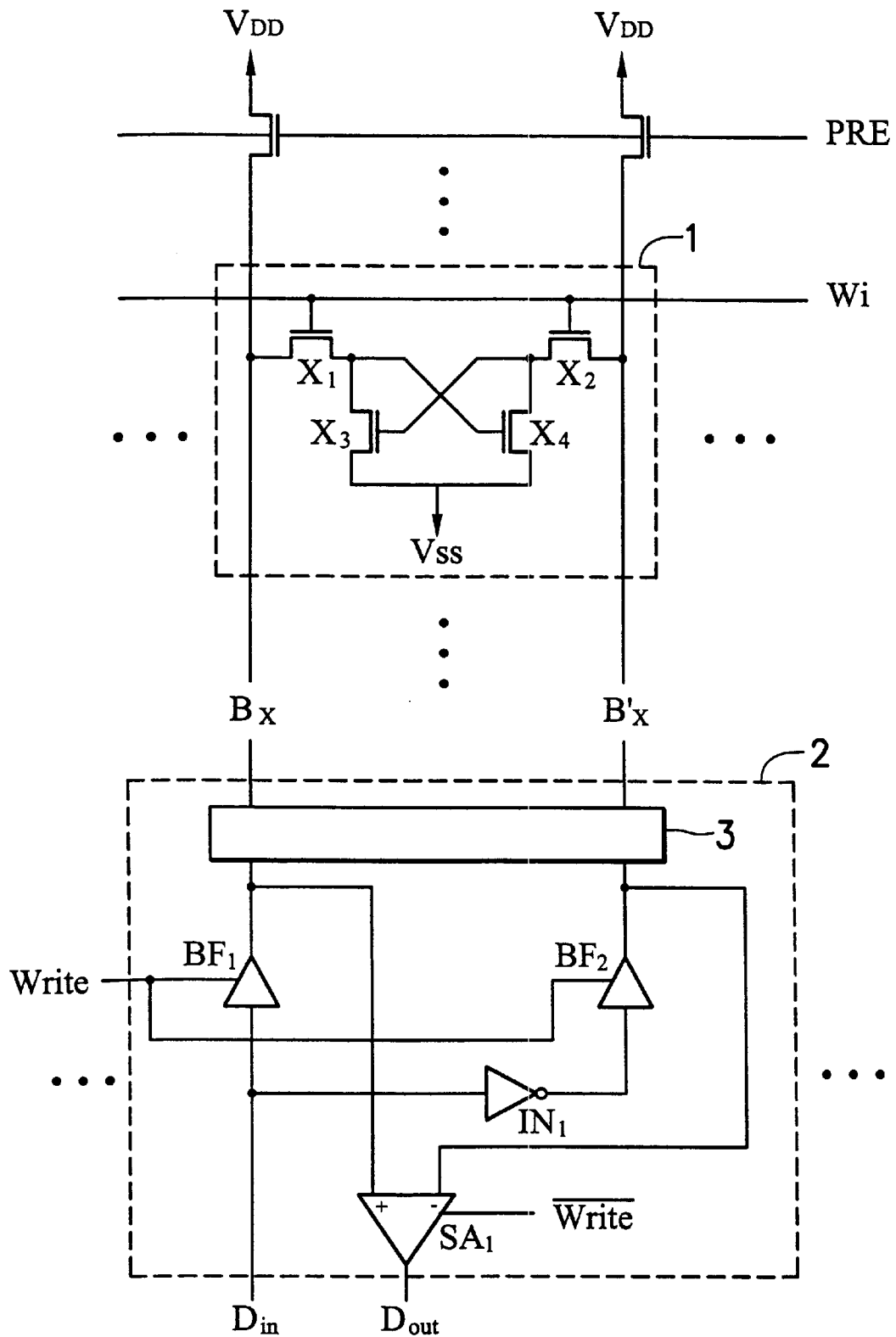
FIG. 3 illustrates a partial access circuit of the pseudo SRAM.
Figure 4A:
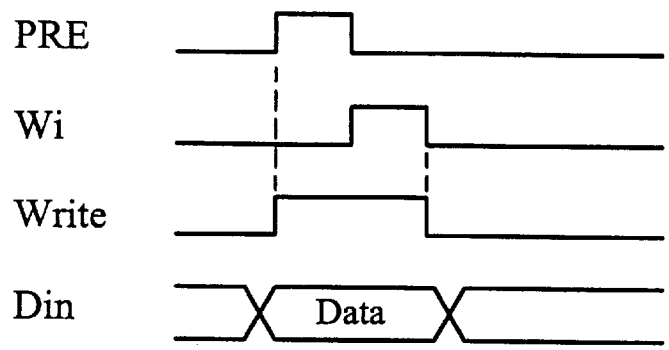
FIGS. 4A to 4C are diagrams illustrating respectively the time sequence of pseudo SRAM in writing, reading and refreshing.
Figure 4B:
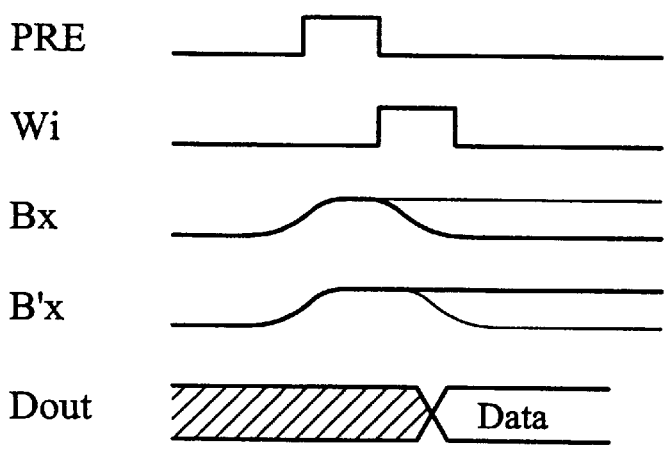
Figure 4C:
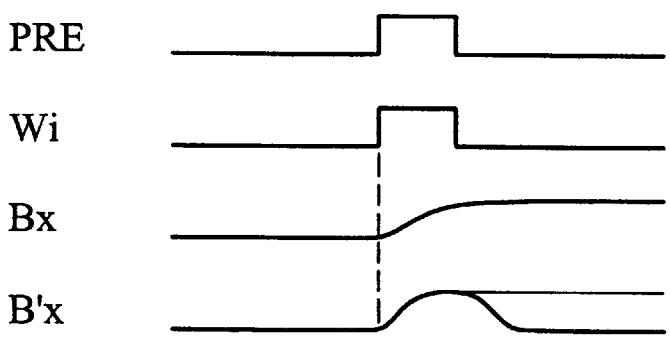
Figure 5A:
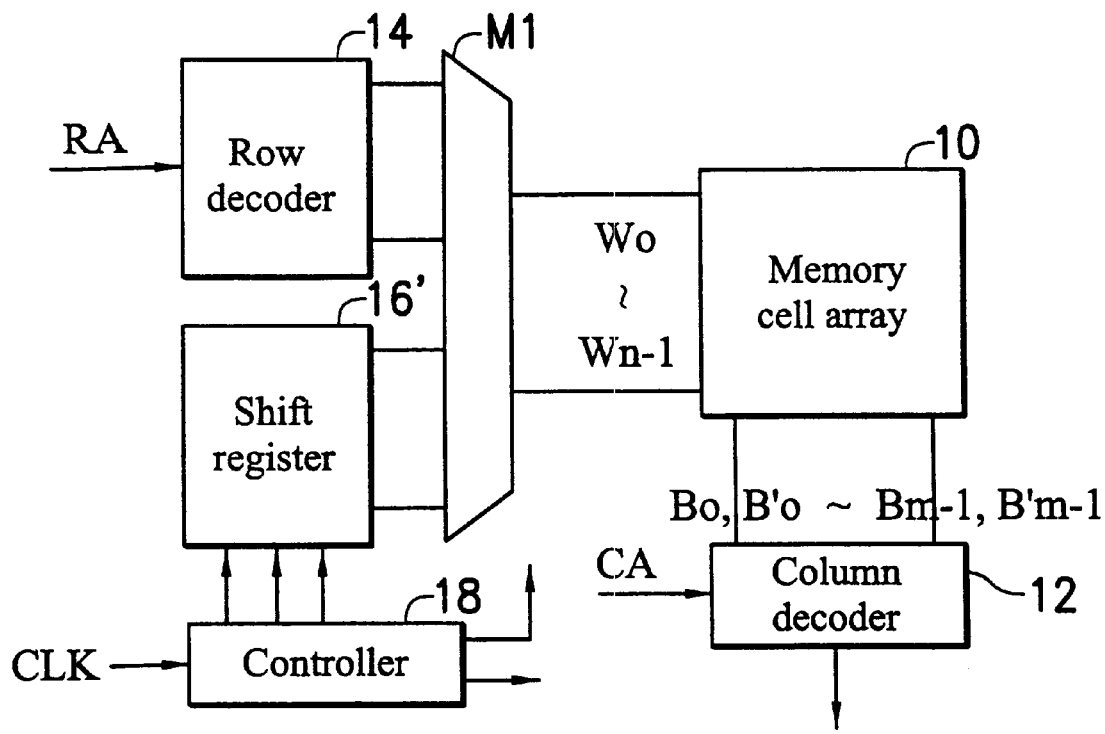
FIG. 5A illustrates the framework of a ring shift register.
Figure 5B:
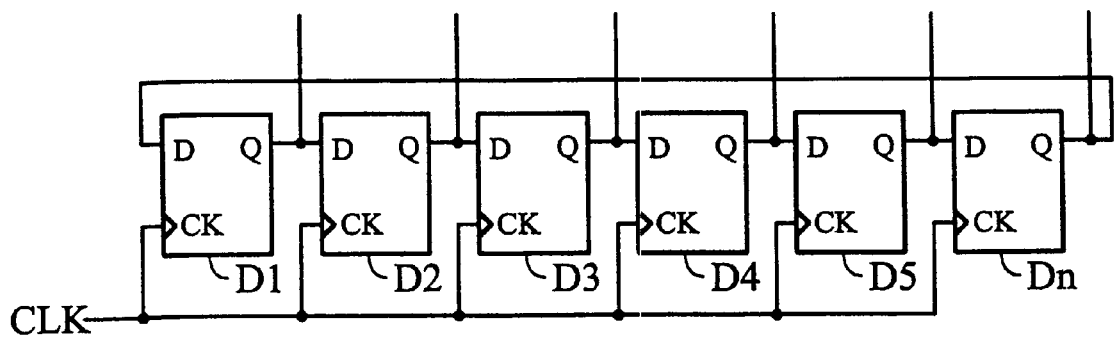
FIG. 5B illustrates the circuit of a ring shift register in FIG. 5A.
Figure 6A:
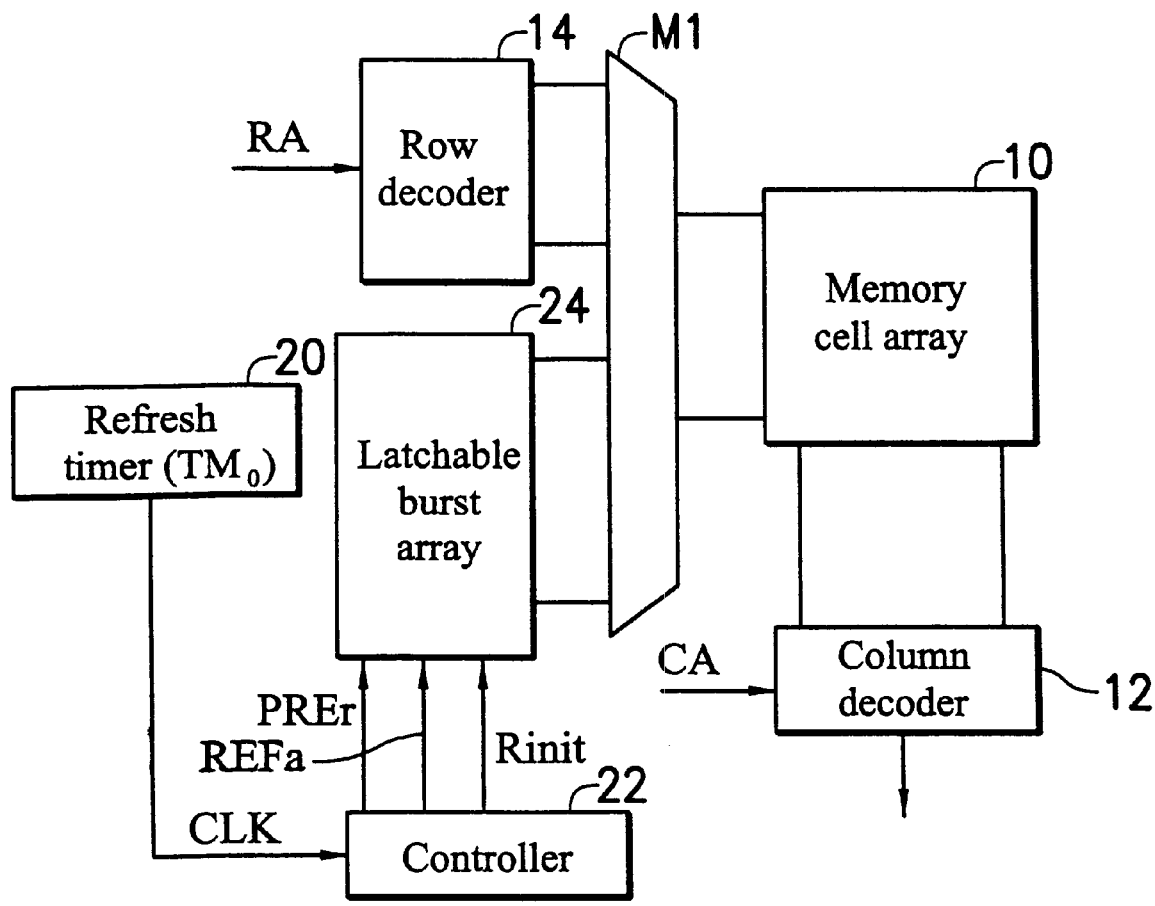
FIG. 6A illustrates the framework of a self row-identified hidden refresh circuit of this invention.

Referring to FIG. 6A, the framework of a self row-identified hidden refresh circuit of this invention is illustrated. In FIG. 6A, the self row-identified hidden refresh circuit includes a refresh timer 20, a controller 22 and a latchable burst array 24. The refresh timer 20 periodically generates a refresh message $TM_0$, which is specified a predetermined frequency (by the refresh timer 20) in accordance with the amount of the leak current of the memory cell. The controller 22 generates pre-charging signal PREa and data accessing signal Wa (synchronized with system clock CLK) for normal read/write access mode. And then, the controller 22 generates the following signal REFa (a first pulse of the burst refresh during each access cycle CLK), pre-charging signal PREr which represents the refresh time span, and an initial refresh signal Rinit for refresh mode, wherein the signal Rinit is generated at the first CLK cycle whenever the message $TM_0$ is received. These signals are then sent to the latchable burst array 24 that generates driving signals for each word line.

Figure 6B:
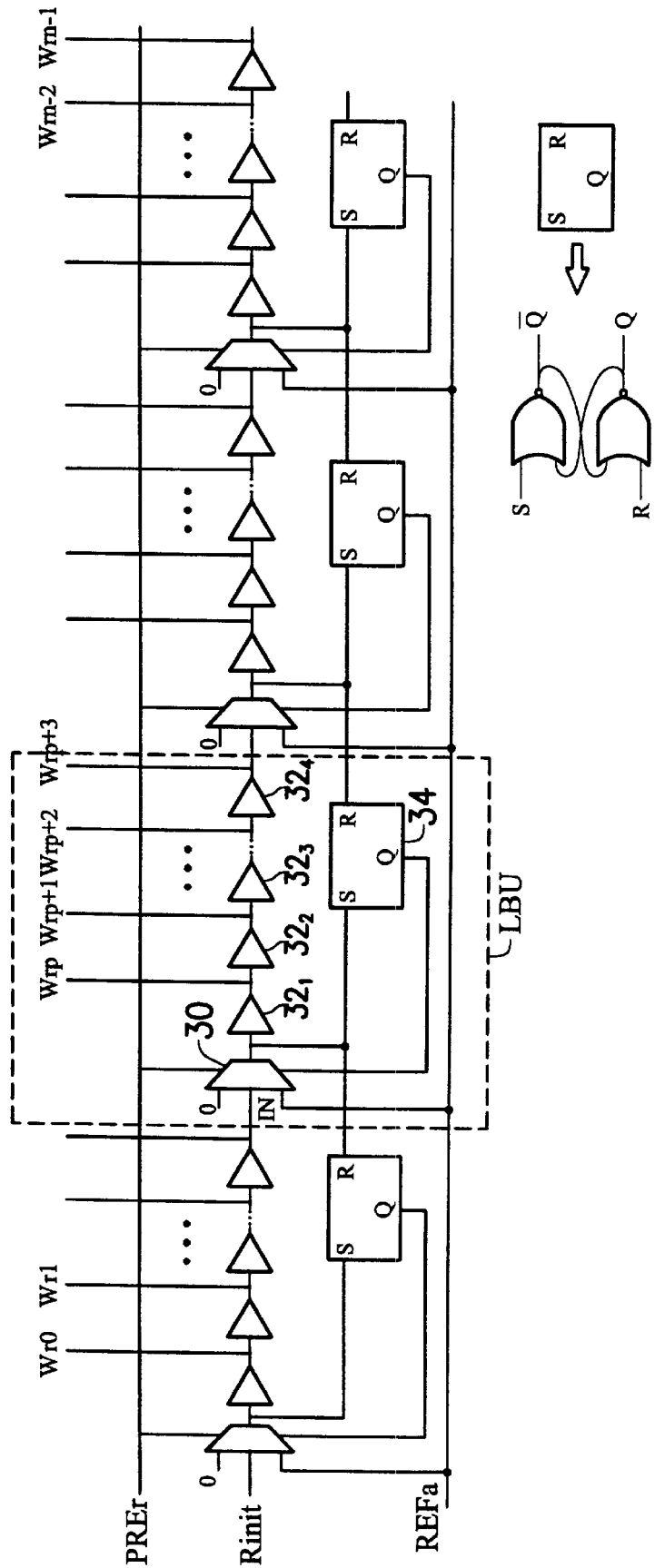
FIG. 6B illustrates the detailed circuit of a latchable burst array of this invention.
Figure 6C:
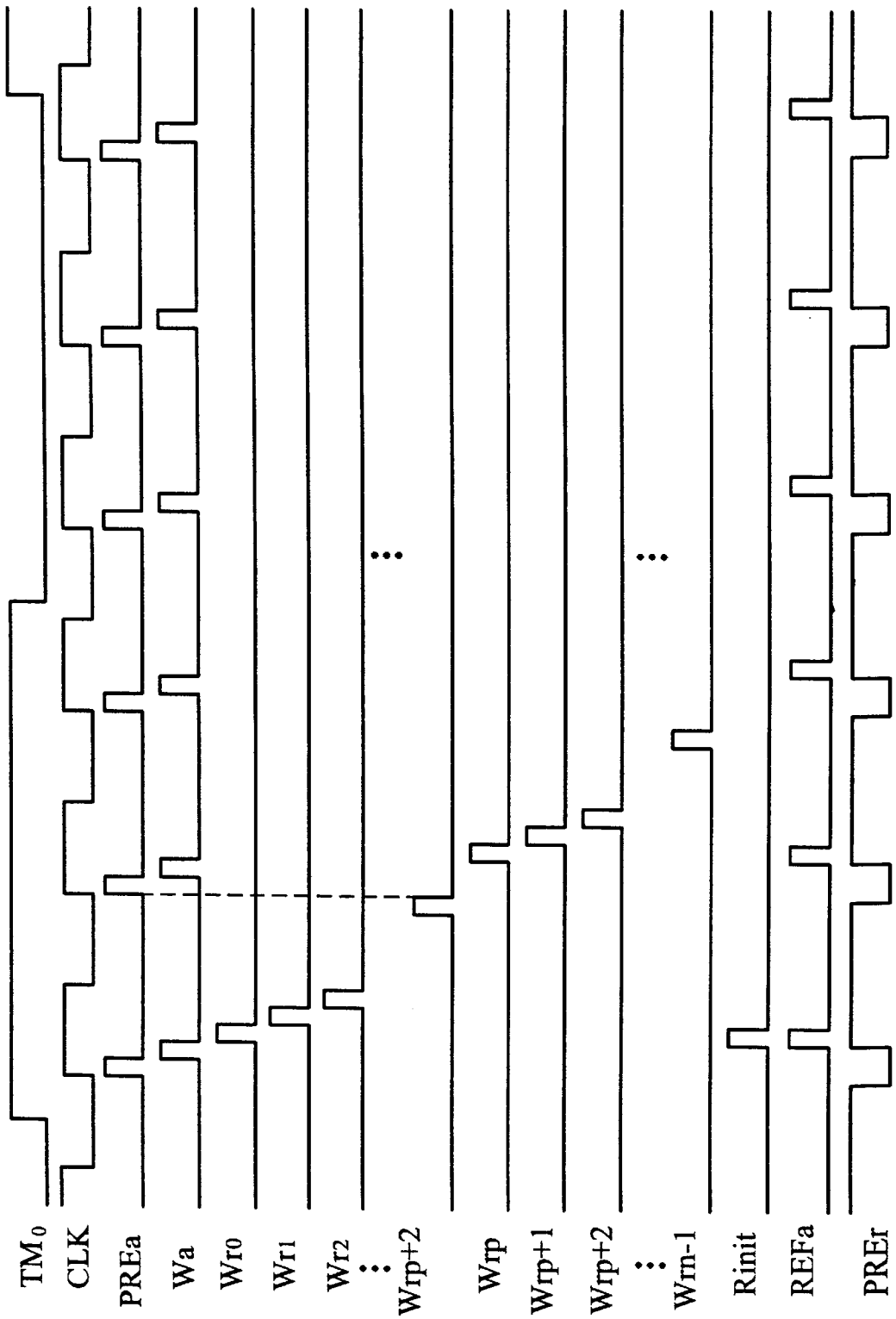
FIG. 6C illustrates the time sequence of a latchable burst array of FIG. 6B.

Referring to FIGS. 6B–6C, a detailed circuit of the latchable burst array 24 is shown. In FIG. 6B, the latchable burst array 24 includes a plurality of latchable burst units (LBU) connected in series, each latchable burst unit (LBU) includes a selector 30, delay elements $32_1$~$32_4$ (in this embodiment four are used) and a state recording device 34 (shown here as an SR flip-flop).

Referring to the following truth table, the selector 30 will select from one of the following: a default value (0V in the embodiment of FIG. 6B), the output from the preceding latchable burst unit IN or the Rinit signal from the first latchable burst unit, and the REFa signal. The selection is made in accordance with the recorded state (represented by the output Q of the SR flip-flop) of the state recording device 34, or a PREr signal. Therefore, the selector 30 will select either the output of the preceding latchable burst array or REFa signal in accordance with the recorded state of the state recording device 34.

Truth table

| PREr | Q | OUT (S/R) |
|---|---|---|
| x | 1 | REFa |
| 1 | 0 | IN (Rinit) |
| 0 | 0 | 0 |

In this embodiment, the state recording device 34 is configured to be set to a first state (such as "L") before the refresh pulse Rinit or REFa enters the latchable burst unit and is configured to be set to a second state (such as "H") after the refresh pulse Rinit or REFa enters the latchable burst unit. And then, the state recording device 34 is reset to the first state "L" when the refresh pulse Rinit or REFa leaves the latchable burst unit. Hence, when the state recorded by the state recording device 34 is "L", it represents that the refresh pulse has not yet entered the latchable burst unit or has left the latchable burst unit in the CLK cycle, the selector 30 then selects the preceding latchable burst unit waiting for the pulse IN or Rinit in the following CLK cycle. When the state recorded by the state recording device 34 is "H", it represents that the refresh pulse IN or Rinit has already entered the latchable burst unit and has not yet left said latchable burst unit in the whole CLK cycle, the selector 30 then selects the REFa signal for restarting refreshing from this latchable burst unit in the next CLK cycle.

Referring to FIG. 6C, the time sequence of the latchable burst array 24 of FIG. 6B is illustrated. In FIG. 6C, signals $W_{r0} \sim W_{rn-1}$ represent driving signals of all word lines outputted from the latchable burst array 24.

With reference to FIGS. 6A–6C, it can be seen that when the refresh message $TM_0$ informs the controller 22 to generate the Rinit signal which is inputted to the latchable burst array 24 through the first latchable burst unit and generates a series of refresh signals through the delay elements $32_1$–$32_4$ until the CLK cycle is finished or the end of the latchable burst array is reached. Each state recording device 34 records the locations of the incoming refresh pulses in accordance with the above method and continues the refresh of the latchable burst unit from its corresponding location at the time of the next access cycle CLK starts. Conversely, when the refresh pulse has reached the end of the latchable burst array 24, the refresh stops until further notice of the next refresh message $TM_0$ is received.

With this framework, the entire pseudo SRAM can be refreshed within several system clocks, and there is no repeated refresh as is encountered with conventional ring structure approaches. Moreover, the time delay provided by each delay element is the time required for a series of refreshes, and the number of the delay elements in each latchable burst unit can be determined in accordance with the need for refresh load and the maximal operation frequency. The lower the demand for maximal operation frequency, the higher the number of the delay elements. Conversely, the higher the demand for maximal operation frequency, the lower the number of the delay elements (even one). The framework of this invention is very close to the framework of the ring shift register. The two differ in that the framework of this invention does not undergo redundant refresh operations (because it is not a ring structure) at high frequency and can pass several latchable burst units simultaneously to reduce the time for refreshing. Consequently, this invention demonstrates better performance than its conventional counterparts.

Figure 7:
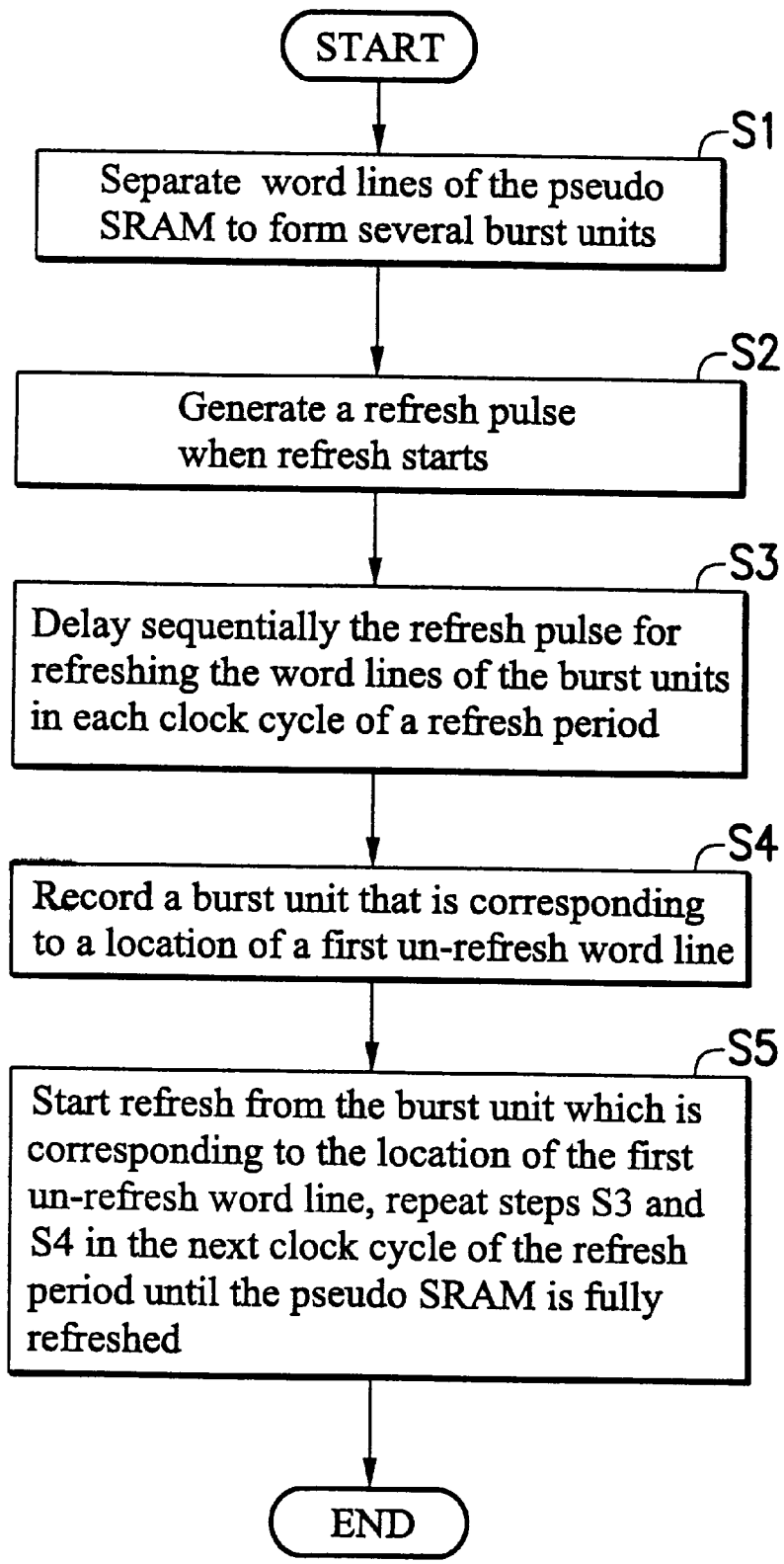
FIG. 7 is a flowchart illustrating a self row-identified hidden refresh method of this invention.

FIG. 7 (with reference to FIGS. 6C) is a flowchart illustrating a hidden refresh method that provides self row recognition. In Step S1, word lines of the pseudo SRAM are separated to form several burst units. Then in Step S2, a refresh pulse Rinit is generated when refresh starts. Then in Step S3, the refresh pulse is sequentially delayed through delay elements ($32_1$~$32_3$) to refresh several rows of word lines (Wrp~Wrp+2) of the burst units in each clock CLK cycle during the refresh period $TM_0$. Next, in Step S4, a burst unit that is corresponding to a location of a first un-refresh word line (Wrp+3) is recorded. Further in Step S5, starting refresh from the burst unit which is corresponding to the location of the first un-refresh word line (Wrp+3) of the pseudo SRAM, wherein the word lines Wrp~Wrp+3 are refreshed. Then, steps S3 and S4 are repeated in the next clock CLK cycle of the refresh period until the pseudo SRAM is fully refreshed, wherein the last word line Wrn−1 is refreshed.

To summarize, this self row-identified hidden refresh circuit and refresh method of the present invention uses a latchable burst array for refreshing several rows of word lines of the pseudo SRAM in each refresh cycle and recording the locations where each refresh cycle ends. In addition, in either high frequency or low frequency operation, better performance is demonstrated when compared with conventional ring shift registers.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A self row-identified hidden refresh circuit for refreshing a pseudo SRAM, comprising:
    a latchable burst array comprising a plurality of latchable burst units, each burst unit equipped with a selector, a plurality of delay elements and a state recording device, wherein said selector is configured to selectively output a refresh pulse in accordance with a recorded state of the state recording device, said refresh pulse being sequentially delayed through said delay elements to refresh a plurality of rows in the pseudo SRAM, and said state recording device is configured to record a first state before the refresh pulse enters said latchable burst units, configured to record a second state after the refresh pulse enters said latchable burst units, and configured to record said first state when the refresh pulse leaves said latchable burst units.

2. The self row-identified hidden refresh circuit of claim 1, wherein said selector comprises a multiplexer and said state recording device comprises an SR flip-flop.

3. The self row-identified hidden refresh circuit of claim 1, wherein the time delay of each of said delay elements is of sufficient duration to refresh a row of said pseudo SRAM.

4. The self row-identified hidden refresh circuit of claim 1, wherein said selector comprises a multiplexer and said state recording device comprises an SR flip-flop, said SR flip-flop being set to said first state before the refresh pulse enters said latchable burst units, set to said second state after the refresh pulse enters said latchable burst units, and reset to said first state when the refresh pulse leaves said latchable burst units.

5. A self row-identified hidden refresh method for refreshing pseudo SRAM, said method comprising the following steps:
    (a) separating a plurality of word lines of said pseudo SRAM to form a plurality of burst units;

(b) generating a refresh pulse upon initiating the refresh;
(c) delaying sequentially said refresh pulse for refreshing the word lines of said burst units in each clock cycle of a refresh period;
(d) recording a burst unit which is corresponding to a location of a first un-refresh word line; and
(e) starting refresh from said burst unit which is corresponding to the location of said first un-refresh word line, and repeating steps (c) and (d) in the next clock cycle of said refresh period until said pseudo SRAM is fully refreshed.

* * * * *